(12) United States Patent
Taniguchi

(10) Patent No.: US 7,018,749 B2
(45) Date of Patent: Mar. 28, 2006

(54) CRYSTALLIZATION APPARATUS, CRYSTALLIZATION METHOD, AND PHASE SHIFT MASK AND FILTER FOR USE IN THESE APPARATUS AND METHOD

(75) Inventor: Yukio Taniguchi, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 225 days.

(21) Appl. No.: 10/661,600

(22) Filed: Sep. 15, 2003

(65) Prior Publication Data

US 2004/0066569 A1 Apr. 8, 2004

(30) Foreign Application Priority Data

Sep. 20, 2002 (JP) ............................. 2002-274968

(51) Int. Cl.
*G01F 9/00* (2006.01)
(52) U.S. Cl. ......................................................... 430/5
(58) Field of Classification Search .................... 430/5; 117/4, 201, 204, 206
See application file for complete search history.

(56) References Cited

U.S. PATENT DOCUMENTS 6,583,855 B1 * 6/2003 Krikke et al. ................. 355/67
6,846,617 B1 * 1/2005 Pierrat ......................... 430/311

FOREIGN PATENT DOCUMENTS

EP 1 047 119 10/2000

OTHER PUBLICATIONS

C.-H. Oh, et al., Applied Surface Science 154-155, pp. 105-111, "Optimization of Phase-Modulated Excimer-Laser Annealing Method for Growing Highly-Packed Large-Grains in Si Thin-Films", 2000.
Masakiyo Matsumura, "Preparation of Ultra-Large Grain Silicon Thin-Films by Excimer-Laser", Surface Science, vol. 21, No. 5, pp. 278-287, 2000.

* cited by examiner

*Primary Examiner*—S. Rosasco
(74) *Attorney, Agent, or Firm*—Oblon, Spivak, McClelland, Maier & Neustadt, P.C.

(57) ABSTRACT

A crystallization apparatus includes an image forming optical system which has an image side numerical aperture set to a value required to generate a light intensity distribution with an inverse peak pattern and sets an amorphous semiconductor film and a phase shift mask to an optically conjugate relationship. The phase shift mask has a boundary area which extends along a first axial line, and a first area and a second area which are arranged on both sides of the boundary area have a predetermined phase difference therebetween. The boundary area has a phase distribution which varies from a phase of the first area to a phase of the second area.

17 Claims, 9 Drawing Sheets

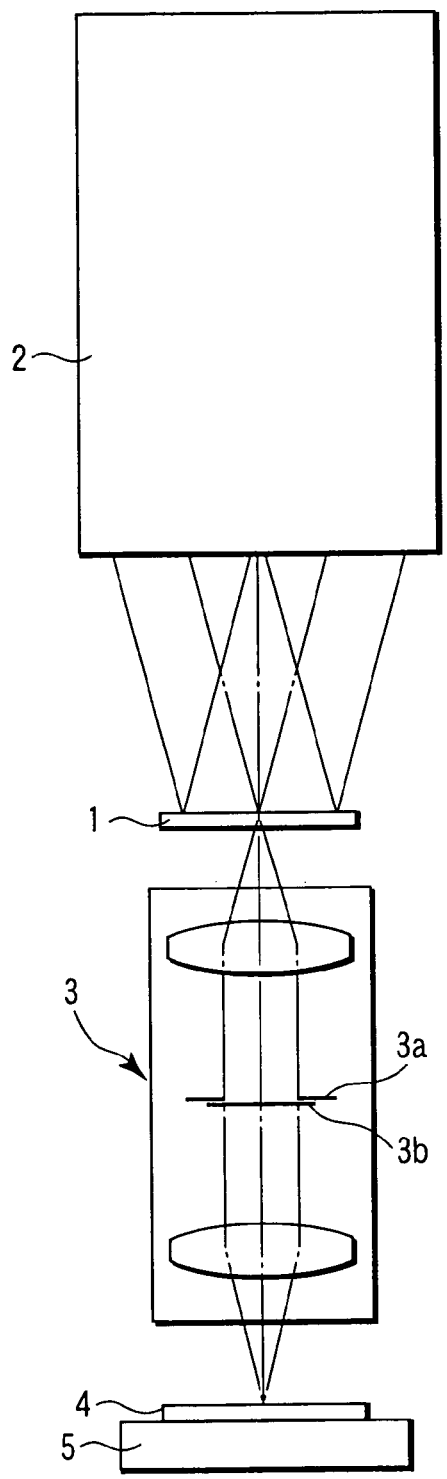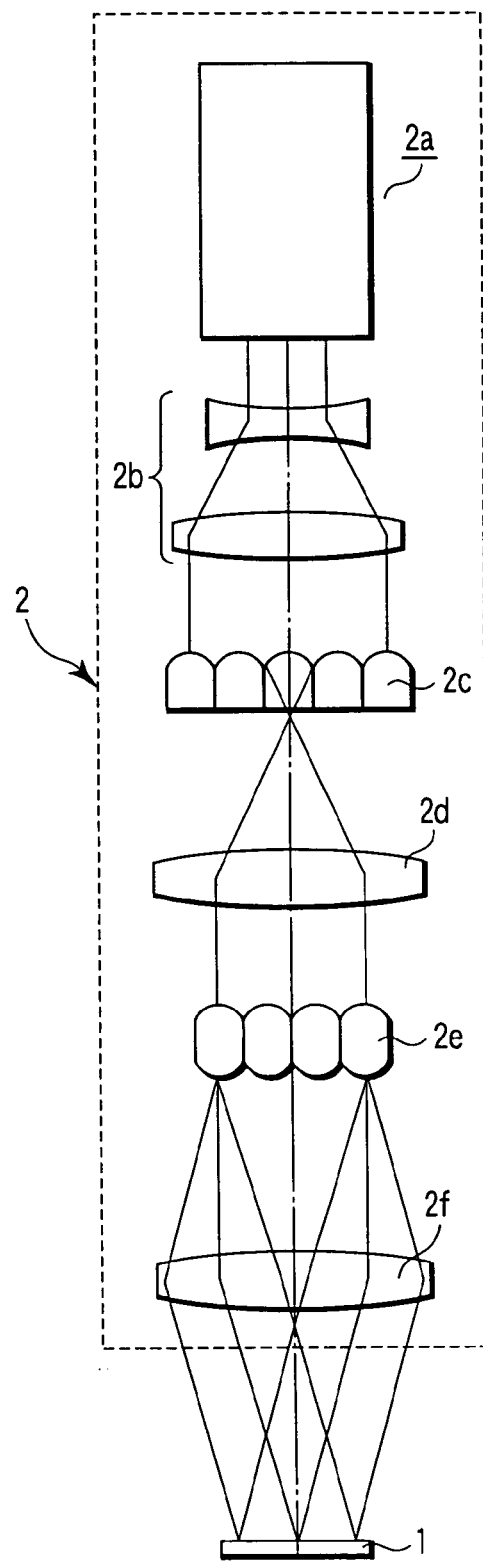
F I G. 1  F I G. 2

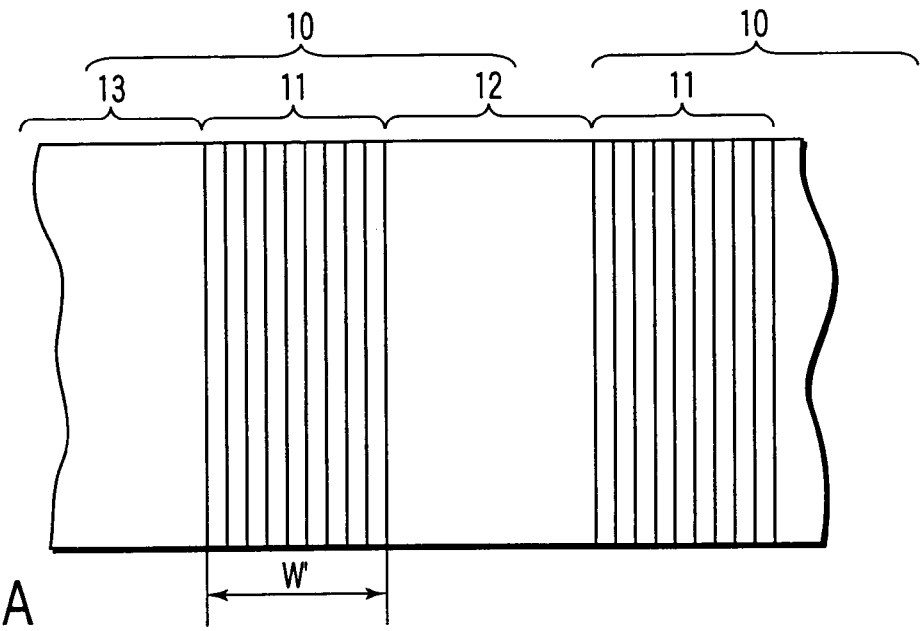
F I G. 3A
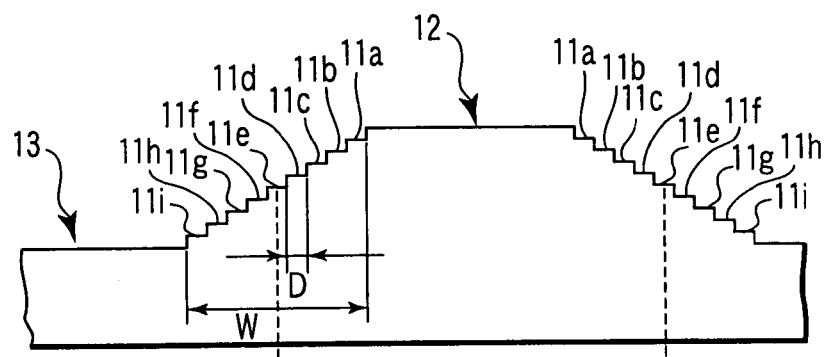
F I G. 3B
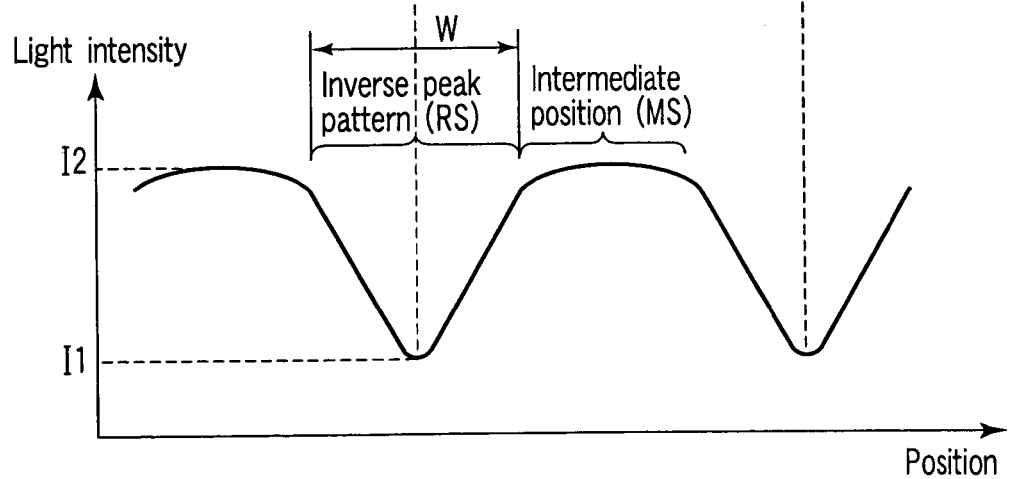
F I G. 3C

CRYSTALLIZATION APPARATUS, CRYSTALLIZATION METHOD, AND PHASE SHIFT MASK AND FILTER FOR USE IN THESE APPARATUS AND METHOD

CROSS-REFERENCE TO RELATED APPLICATIONS

This application is based upon and claims the benefit of priority from the prior Japanese Patent Application No. 2002-274968, filed Sep. 20, 2002, the entire contents of which are incorporated herein by reference.

BACKGROUND OF THE INVENTION

1. Field of the Invention

The present invention relates to a crystallization apparatus, a crystallization method, and a phase shift mask and a filter for use in these apparatus and method. More particularly, the present invention relates to an apparatus and a method which irradiate a polycrystal semiconductor film or layer, or an amorphous semiconductor film or layer with a laser beam phase-modulated by using a phase shift mask, thereby generating a crystallized semiconductor film.

2. Description of the Related Art

Materials of a thin film transistor (TFT) used in a switching element or the like which controls a voltage to be applied to pixels of, e.g., a liquid crystal display (LCD) are conventionally roughly classified into amorphous silicone and polysilicon.

The polysilicon has a higher electron mobility than that of the amorphous silicon. Therefore, when a transistor is formed by using the polysilicon, a switching speed is higher than that obtained when using the amorphous silicon, and a response speed of a display using such a transistor is also higher. Further, a peripheral LSI can be constituted by such a thin film transistor. Furthermore, there is an advantage that a design margin of any other component can be reduced. Moreover, when peripheral circuits such as a driver circuit or a DAC as well as a display main body are incorporated into a display, these peripheral circuits can be operated at a higher speed.

The polycrystal silicon is composed of a group of crystal grains, and has a lower electron mobility than that of monocrystal silicon. In a small transistor formed by using the polycrystal silicon, irregularities in a crystal grain boundary number in a channel portion become a problem. Thus, in recent years, in order to increase the electron mobility and reduce irregularities in the crystal grain boundary number in the channel portion, there has been proposed a crystallization method which generates monocrystal silicon with a large particle size.

As this type of crystallization method, there has been conventionally known "phase control ELA (Excimer Laser Annealing)" which irradiates a phase shift mask which is in close vicinity to a polycrystal semiconductor film or an amorphous semiconductor film in parallel, with an excimer laser beam, thereby generating a crystallized semiconductor film. The detail of the phase control ELA is disclosed in, e.g., "Surface Science Vol. 21, No. 5, pp. 278–287, 2000".

In the phase control ELA, a light intensity distribution having an inverse peak pattern that a light intensity is minimum or substantially zero at a point corresponding to a phase shift portion of a phase shift mask (pattern that a light intensity is substantially zero at the center and the light intensity is suddenly increased toward the circumference) is generated. A polycrystal semiconductor film or an amorphous semiconductor film is irradiated with the light having this light intensity distribution with the inverse peak pattern and thus locally fused. As a result, a temperature gradient is generated in a fusion area or areas of the film in accordance with the light intensity distribution, a crystal nucleus or nuclei are formed at parts which first solidify in accordance with points where the light intensity are substantially zero, and crystals grow in a lateral direction (lateral growth) from the crystal nuclei toward the circumference, thereby generating monocrystal grains with a large particle size.

The phase shift mask generally used in a prior art is a so-called line type phase shift mask, which is constituted by pairs of rectangular areas which are alternately repeated along one direction, and a phase difference of $\pi$ (180 degrees) is given between the adjacent areas. In this case, since a boundary between the adjacent areas constitutes a phase shift portion, light passing through the mask has such a light intensity distribution having an inverse peak pattern such as that a light intensity is minimum or substantially zero at a position on a line corresponding to the phase shift portion and the light intensity is one-dimensionally increased toward the circumference. Thus, a polycrystal semiconductor film or an amorphous semiconductor film is irradiated with such a light.

As described above, in the prior art using the line type phase shift mask, a temperature becomes lowest along the line corresponding to the phase shift portion, and a temperature gradient is generated along a direction orthogonal to the line corresponding to the phase shift portion. That is, a crystal nucleus or nuclei are generated on the line corresponding to the phase shift portion, and crystallization advances from each crystal nucleus along a direction orthogonal to the line corresponding to the phase shift portion. In the prior art using such a phase shift mask, it is general that the light intensity distribution in an intermediate portion between two adjacent inverse peak pattern portions has an irregular undulation (which will be described later in detail with reference to FIG. 5). In this case, a crystal nucleus may be possibly generated at a position where the light intensity is low (i.e., at an undesired position) in the undulation of the intermediate portion in a crystallization process. Moreover, the lateral growth which has begun from the crystal nucleus toward the circumference may stop at a part in the intermediate portion where the light intensity is decreased, which obstructs growth of a large crystal.

BRIEF SUMMARY OF THE INVENTION

It is an object of the present invention to provide a crystallization apparatus and a crystallization method which may realize a sufficient lateral growth from a crystal nucleus and generate a crystallized semiconductor film with a large particle size.

It is a second object of the present invention to provide a crystallization apparatus and a crystallization method which may two-dimensionally substantially control a crystal formation area by controlling a position of a crystal nucleus, and may realize a sufficient lateral growth from a crystal nucleus, thereby generating a crystallized semiconductor film with a large particle size.

To achieve the first object, in a first aspect of the present invention, there is provided a crystallization apparatus which includes an illumination system which illuminates a phase shift mask, and irradiates a polycrystal semiconductor film or an amorphous semiconductor film with a light having a light intensity distribution with an inverse peak pattern that a light intensity is minimum in an area corresponding to a phase shift portion of the phase shift mask, thereby generating a crystallized semiconductor film, comprising:

an image forming optical system which has an image side numerical aperture set to a value required to generate the light intensity distribution with the inverse peak pattern, and sets the polycrystal semiconductor film or the amorphous semiconductor film and the phase shift mask to an optically conjugate relationship. The phase shift mask has a boundary area extending along a first axial line, and a first area and a second area which are arranged on both sides of the boundary area along a second axial line intersecting with (preferably orthogonal to) the first axial line and have a predetermined phase difference. The boundary area has a phase distribution which varies from a phase of the first area to a phase of the second area along the second axial line.

Here, although it is general for the "phase shift mask" to have a structure that a phase is discontinuously shifted, a structure that a phase is continuously shifted is also included in the present invention. Additionally, a meaning of "phase shift" also complies with this.

According to the first aspect, the boundary area has a phase distribution which continuously varies along the second axial line. Alternatively, it is desirable that the boundary area has a phase distribution which varies in a step form along the second axial line. Further, it is preferable that a plurality of phase shift basic patterns each consisting of the first area, the boundary area and the second area are repeatedly formed along the second axial line.

Furthermore, according to a preferred mode of the first aspect, a small area with a predetermined shape is formed in the boundary area, and a second phase difference is given between the small area and a circumferential area of the small area. In this case, it is preferable that the small area is formed at a position corresponding to an area where a light intensity is minimum in the boundary area. Moreover, it is preferable that the second phase difference is approximately 180 degrees.

Additionally, according to a preferred mode of the first embodiment, the image forming optical system has a low pupil function that a transmittance distribution is lower at the circumference than at the center. In this case, it is preferable for the image forming optical system to have a pupil function with a Gauss type transmittance distribution. Further, it is preferable that a filter having a numerical aperture corresponding to the pupil function is arranged on a pupil plane of the image forming optical system or in the vicinity thereof.

Furthermore, according to a preferred mode of the first aspect, assuming that NA is an image side numerical aperture of the image forming optical system, λ is a wavelength of a light and r is a radius of a circle circumscribing the small area, a condition of $0.05\lambda/NA \leq r \leq \lambda/NA$ is satisfied.

In a second aspect of the present invention, there is provided a crystallization method which illuminates a phase shift mask, and irradiates a polycrystal semiconductor film or an amorphous semiconductor film with a light having a light intensity distribution with an inverse peak pattern that a light intensity is minimum in an area corresponding to a phase shift portion of the phase shift mask, thereby generating a crystallized semiconductor film, comprising:

arranging an image forming optical system in a light path between the polycrystal semiconductor film or the amorphous semiconductor film and the phase shift mask;

setting an image size numerical aperture of the image forming optical system to a value required to generate the light intensity distribution with the inverse peak pattern;

setting the polycrystal semiconductor film or the amorphous semiconductor film to a position which is optically conjugate with the phase shift mask through the image forming optical system; and using a phase sift mask which has a boundary area extending along a first axial line, and a first area and a second area which are arranged on both sides of the boundary area along a second axial line orthogonal to the first axial line and have a predetermined phase difference, the boundary area having a phase distribution which varies from a phase of the first area to a phase of the second area along the second axial line.

In a third aspect of the present invention, there is provided a phase shift mask, wherein the phase shift mask has a boundary area extending along a first axial line, and a first area and a second area which are arranged on both sides of the boundary area along a second axial line orthogonal to the first axial line and have a predetermined phase difference, the boundary area having a phase distribution which varies from a phase of the first area to a phase of the second area along the second axial line. In this case, it is desirable that a small area having a predetermined shape is formed in the boundary area, and a second phase is given between the small area and a surrounding area of the small area.

In a fourth aspect of the present invention, there is provided a filter which is arranged on a pupil plane of an image forming optical system or in the vicinity thereof and defines a pupil function, comprising a plurality of aperture portions formed so as to be associated with the pupil function.

As described above, in the present invention, since the phase shift mask has a boundary area and first and second areas which are arranged on both sides of the boundary area and have a phase difference and the boundary area has a phase distribution which varies from a phase of the first area to a phase of the second area, a conformation of the light intensity distribution with the inverse peak pattern obtained on a processed substrate can be controlled as a whole, and an irregular undulation can be eliminated from the light intensity distribution in an intermediate portion. As a result, in the present invention, a crystal nucleus can be generated at a desired position, a sufficient lateral growth from the crystal nucleus can be realized, thereby generating a crystallized semiconductor film with a large particle size.

Further, in the present invention, a small area with a predetermined shape is formed in the boundary area of the phase shift mask, and a predetermined phase difference is given between the small area and a surrounding area of this small area. As a result, a crystal nucleus generation position is restricted to an area corresponding to the small area as the phase shift portion of the phase shift mask, and a growth direction of a crystal from a crystal nucleus is one-dimensionally limited to a direction of a phase change, thereby substantially controlling a crystal grain boundary formation position. In other words, in the present invention, the crystal formation area can be two-dimensionally substantially controlled by controlling a position of the crystal nucleus, and a sufficient lateral growth from the crystal nucleus can be realized, thereby generating a crystallized semiconductor film with a large particle size.

Objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a view schematically showing a structure of a crystallization apparatus according to a first embodiment of the present invention;

FIG. 2 is a view schematically showing an internal structure of an illumination system shown in FIG. 1;

FIGS. 3A to 3C are views illustrating a structure and an effect of a basic unit part of a phase shift mask according to a first embodiment, in which FIGS. 3A and 3B are plane view and a side view schematically showing the basic unit part of the phase shift mask and FIG. 3C is a view showing a light intensity distribution pattern of a light outgoing from the phase shift mask;

FIGS. 7A to 7D are views illustrating a structure and an effect of a basic unit part of a phase shift mask according to a second embodiment, in which FIGS. 7A and 7B are a plane view and a side view schematically showing the basic unit part of the phase shift mask and FIGS. 7C and 7D are views respectively showing light intensity distribution patterns of a light outgoing from the phase shift mask in the form of intensities taken along the line 7C—7C and the line 7D—7D in FIG. 7A;

DETAILED DESCRIPTION OF THE INVENTION

Figures 4A, 4B:
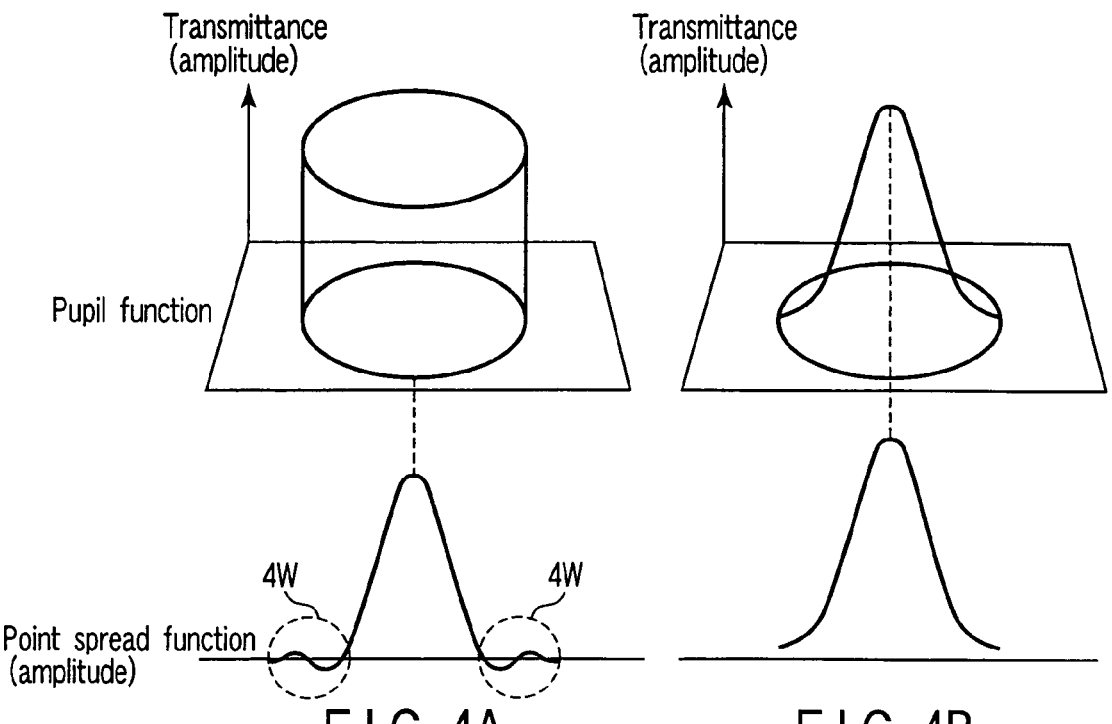
FIGS. 4A and 4B are views typically showing a relationship between a pupil function of an image forming optical system and a point spread function.

Embodiments according to the present invention will now be described with reference to the accompanying drawings.

FIG. 1 is a view schematically showing a structure of a crystallization apparatus according to a first embodiment of the present invention, and FIG. 2 is a view schematically showing an internal structure of an illumination system of FIG. 1. Referring to FIGS. 1 and 2, the crystallization apparatus according to the first embodiment includes an illumination system 2 which illuminates a phase shift mask 1. As shown in FIG. 2, the illumination system 2 has a light source (preferably a laser light source, e.g., a KrF excimer laser light source) 2a which supplies a light having a waveform of 248 nm, an outgoing beam expander 2b, and first and second homogenizers which are sequentially arranged on a laser beam outgoing radiation side of the light source.

In the illumination system 2, a laser beam emitted from the light source 2a is expanded through the beam expander 2b and then enters a first fly-eye lens 2c. In this manner, a plurality of light sources are formed on a rear side focal plane of the first fly-eye lens 2c, and light fluxes from a plurality of these light sources illuminate an incident plane of a second fly-eye lens 2e in the superimposed manner through a first condenser optical system 2d. As a result, more light sources than those on the rear side focal plane of the first fly-eye lens 2c are formed on a rear side focal plane of the second fly-eye lens 2e. Light fluxes from a plurality of the light sources formed on the rear side focal plane of the second fly-eye lens 2e illuminate a phase shift mask 1 in the superimposed manner through a second condenser optical system 2f.

The first fly-eye lens 2c and the first condenser optical system 2d constitute the first homogenizer. The first homogenizer performs homogenization concerning an incident angle on the phase shift mask 1. The second fly-eye lens 2e and the second condenser optical system 2f constitute the second homogenizer. The second homogenizer achieves homogenization concerning an in-plane position on the phase shift mask 1. In this manner, the illumination system 2 irradiates the phase shift mask 1 arranged so as to be orthogonal to an optical axis with the light having a substantially uniform light intensity distribution on a laser beam outgoing radiation side of this illumination system 2.

As shown in FIG. 1, a processed substrate 4 is irradiated with the laser beam, which has been phase-modulated via the phase shift mask 1 as will be described later, through an image forming optical system 3. Here, the image forming optical system 3 arranges the phase shift mask 1 and a processed plane of the processed substrate 4 so as to be optically conjugate. In other words, the processed substrate 4 is set to a plane which is optically conjugate with the phase shift mask 1 (image plane of the image forming optical system 3). The image forming optical system 3 includes an aperture diaphragm 3a arranged on its pupil plane. The aperture diaphragm 3a can be arranged so as to be appropriately replaceable with respect to a light path when a plurality of aperture diaphragms whose aperture portions (light transmission portions) have different sizes are prepared in advance. This replacement may be manually or automatically carried out.

Alternatively, the aperture diaphragm 3a may have an iris diaphragm which can continuously or intermittently change a size of an aperture portion by a manual or automatic operation. In any case, a size of the aperture portion of the aperture diaphragm 3a (i.e., an image side numeral aperture NA of the image forming optical system 3) is set so as to generate a light intensity distribution with a required inverse peak pattern on a top surface of a semiconductor film (a film or a layer to be crystallized) of the processed substrate 4. Reference numeral 3b shows a filter described later. The image forming optical system 3 may be of an inflection type optical system, a reflection type optical system, or an inflection and reflection type optical system.

The processed substrate 4 is obtained by forming on an underlying film formed on, e.g., a liquid crystal display flat glass by a chemical vapor deposition method (an amorphous silicon film or a polycrystal silicon film on this underlying film). The glass plate on which the substrate 4 is mounted, is held at a predetermined position on a substrate stage 5 by a vacuum chuck or an electrostatic chuck. The substrate stage 5 can move together with the processed substrate 4 in directions of XYZ by a known technique.

FIGS. 3A to 3C are views schematically showing a structure and an effect of a basic unit part of the phase shift mask according to the first embodiment. Referring to FIGS. 3A and 3B, each of a plurality of basic unit parts (phase shift basic patterns) 10 constituting the phase shift mask 1 is configured by a boundary area 11 extending along a vertical direction in FIG. 3A, and a first area 12 and a second area 13 which are arranged on both sides of the boundary area 11 in a horizontal direction and extend in parallel to the boundary area 11. Here, with a transmission light ray of the first area 12 being determined as a reference, a phase difference of 360 degrees is given to a transmission light ray of the second area 13.

The boundary area 11 has a phase distribution which varies in a step form from a phase (0 degree) of the first area 12 to a phase (360 degrees) of the second area 13 along a horizontal direction in the drawing. Further, in detail, as shown in FIG. 3B, the boundary area 11 is constituted by a first boundary area section 11a, a second boundary area section 11b, a third boundary area section 11c, a fourth boundary area section 11d, a fifth boundary area section 11e, a sixth boundary area section 11f, a seventh boundary area section 11g, an eighth boundary area section 11h, and a ninth boundary area section 11i in the mentioned order from the first area 12 side in a descent step fashion. Although not necessarily required, each boundary area section is formed to have the same width and length.

Here, determining the transmission light ray of the first area 12 as a reference, phase differences of 30 degrees, 60 degrees, 90 degrees, 135 degrees, 180 degrees, 225 degrees, 270 degrees, 300 degrees and 330 degrees are given to the transmission light rays of the first boundary area section 11a to the ninth boundary area section 11i. In the above description, as to the phase difference, a direction along which the phase advances is defined as positive. Specifically, when the phase shift mask 1 is formed of, e.g., a quartz glass having a refractive index of 1.5 to a light ray having a wavelength of 248 nm, a step or height difference of 496 nm is given between the first area 12 and the second area 13.

Further, a step of approximately 41.3 nm is given between the first area 12 and the first boundary area section 11a; a step of approximately 41.3 nm, between the first boundary area section 11a and the second boundary area section 11b; a step of approximately 41.3 nm, between the second boundary area section 11b and the third boundary area section 11c; a step of 62 nm, between the third boundary area section 11c and the fourth boundary area section 11d; a step of 62 nm, between the fourth boundary area section 11d and the fifth boundary area section 11e; a step of 62 nm, between the fifth boundary area section 11e and the sixth boundary area section 11f; a step of 62 nm, between the sixth boundary area section 11f and the seventh boundary area section 11g; a step of approximately 41.3 nm, between the seventh boundary area section 11g and the eighth boundary area section 11h; a step of approximately 41.3 nm, between the eighth boundary area section 11h and the ninth boundary area section 11i; and a step of approximately 41.3 nm, between the ninth boundary area section 11i and the second area 13.

In this case, as will be described later, the fifth boundary area section 11e having a phase difference of 180 degrees constitutes a phase shift portion which linearly extends. Furthermore, the phase shift mask 1 is constituted by one-dimensionally arranging the basic unit portions 10. That is, in the phase shift mask 1, a phase shift basic pattern consisting of the first area 12, the boundary area 11 and the second area 13 is repeatedly formed along the horizontal direction in the drawing. However, in the illustrated pattern, positive and negative of inclinations of the phase are alternately repeated. Both a part where the inclination of the phase is positive and a part where the inclination of the phase is negative give the same light intensity distribution. Moreover, in the phase shift mask 1, its phase shift pattern (step) is formed on a plane opposed to the processed substrate 4.

In the first embodiment, when the phase shift mask 1 is used and an aperture diameter (i.e., the image side numerical aperture NA) of the aperture diaphragm 3a of the image forming optical system 3 is set to a predetermined value, there is formed on the processed substrate 4 a light intensity distribution with an inverse peak pattern such as that the light intensity is minimum ($I_1$) in a linear area corresponding to the fifth boundary area section 11e as the phase shift portion and the light intensity is one-dimensionally substantially monotonously increased toward the first and second areas 12, 13 in a direction (horizontal direction in the drawing) orthogonal to a direction that the linear area extends, as shown in FIG. 3C. An effect of the phase shift mask 1 according to the first embodiment, especially an effect of the boundary area 11 will now be briefly described hereinafter.

Generally, in the light intensity distribution formed on the processed substrate through the image forming optical system by the light fluxes passing through areas of phase shift mask 1 having a phase distribution which continuously or intermittently varies, the light intensity substantially corresponds to a gradient of a phase change. That is, the light intensity in a substrate area corresponding to a mask area that an absolute value of a gradient of a phase change is small becomes large, and the light intensity in a substrate area corresponding to a mask area that an absolute value of a gradient of a phase change is large becomes small.

As indicated by the following expression (1), this can be understood from a fact that a complex amplitude distribution I (u, v) of an image is given by a convolution integral of a complex amplitude distribution O (u, v) of an object and a complex amplitude distribution of a point image (point spread function) ASF (u, v). In the expression (1), "∫" is an integration symbol.

$$I(u, v) = \int\int \{O(u', v') ASF(u-u', v-v')\} du' dv' \quad (1)$$

However, when an image forming optical system having a regular pupil function that a transmittance distribution is uniform is used, as shown in FIG. 4A, since the point spread function becomes negative in the circumferences (point spread function is a Fourier transform of the pupil function), a relationship between a phase change and a light intensity is not complete, and small waves (fluctuation) 4W remain in the light intensity distribution. On the contrary, when using an image forming optical system having a pupil function that a transmittance distribution is lower at the circumference than at the center, e.g., a pupil function that a transmittance distribution is of a Gauss type, as shown in FIG. 4B, a negative part of the point spread function is eliminated. This can be readily understood considering a fact that the Fourier transform of the Gauss distribution is the Gauss distribution. As a result, the relationship between the phase change and the light intensity becomes further complete, and the small waves 4W shown in FIG. 4A can be eliminated from the light intensity distribution.

In the above description, there is assumed a case that the phase shift mask has a phase distribution which continuously varies. However, even in case of approximating changes in the phase distribution in incremental steps like the first embodiment, if a width D (see FIG. 3B) of each step in the boundary area 11 is smaller than a resolution R ($\approx\lambda/NA$) of the image forming optical system, namely, if the following conditional expression (2) is satisfied, it is possible to obtain the light intensity distribution which sufficiently smoothly varies.

$$D < \lambda/NA \quad (2)$$

Figure 5:
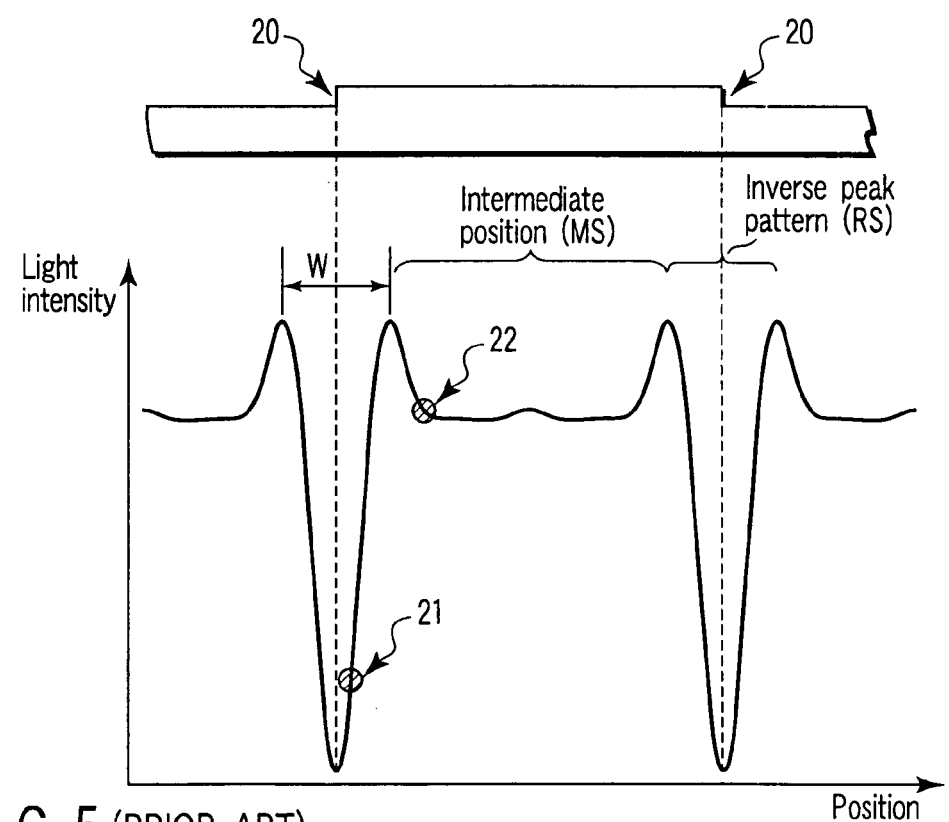
FIG. 5 is a view showing a conventional line type phase shift mask and a light intensity distribution obtained on a processed substrate or film when this mask is used as a comparative example of the first embodiment.

FIG. 5 is a view showing a light intensity distribution which can be obtained on the processed substrate when a conventional line type phase shift mask is used as a comparative example of the first embodiment. In the apparatus according to the first embodiment, a light intensity distribution with an inverse peak pattern obtained by using the conventional line type phase shift mask has, as shown in FIG. 5, a characteristic that a light intensity is substantially 0 (minimum) at a position corresponding to a phase shift portion (border line between two areas to which a phase difference of, e.g., 180 degrees is given) 20 of the phase shift mask and the light intensity is one-dimensionally increased toward the lateral direction.

Referring to FIG. 5, the light intensity distribution at an intermediate portion MS between two adjacent inverse peak pattern portions RS formed in accordance with two phase shift portions 20 adjacent to each other involves an irregular undulation (wave-like distribution such as that an increase and a decrease in light intensity are repeated). In this case, although it is desirable that a crystal nucleus 21 is generated at a position with a large inclination in the light intensity distribution of the inverse peak pattern portion RS or a position with a predetermined light intensity (generally, a position where the intensity is slightly higher than that at a minimum intensity position), a crystal nucleus 22 may be generated at a position where the light intensity is low in the undulation of the intermediate portion (i.e., an undesired position) in some cases.

Even if the crystal nucleus is generated at a desired position, the lateral growth which has started from the crystal nucleus toward the circumference stops at a part where the light intensity is decreased on the boundary between the inverse peak pattern portion and the intermediate portion. In other words, since the lateral growth from the crystal nucleus is restricted to a range of a widthwise dimension W of the inverse peak pattern, a growth of a sufficiently large crystal is obstructed. It is to be noted that the widthwise dimension W of the inverse peak pattern is substantially equivalent to a resolution R of the image forming optical system in the technique according to the first embodiment, i.e., a projection NA method.

Assuming that $\lambda$ is a wavelength of a light ray or laser beam used and NA is an image side numerical aperture of the image forming optical system 3, the resolution R of the image forming optical system 3 is defined by $R=k\lambda/NA$. Here, although a constant k varies depending on a specification of the illumination system 2 which illuminates the phase shift mask 1, a degree of a coherence of the light flux supplied from the light source 1 and a definition of the resolution, it is a value which is substantially close to 1. As described above, in the projection NA method, when the image side numerical aperture NA of the image forming optical system 3 is reduced and the resolution of the image forming optical system 3 is lowered, a widthwise dimension of the inverse peak pattern is increased.

As mentioned above, in the prior art using the line type phase shift mask, the light intensity becomes minimum (nearly 0) at a position corresponding to the phase shift portion 20 as a result of an interference between the two areas to which a phase difference of 180 degrees is given, and the widthwise dimension W of the inverse peak pattern is stipulated by the resolution R of the image forming optical system, but an irregular undulation is generated in the light intensity distribution at the intermediate portion.

On the other hand, in the phase shift mask 1 according to the first embodiment, the boundary area 11 having a phase distribution which varies from a phase (0 degree) of the first area 12 to a phase (360 degrees) of the second area 13 in the step form is formed between the two areas 12, 13 to which a phase difference of 360 degrees is given, i.e., the first area 12 and the second area 13. Therefore, on the processed subtrate 4, as shown in FIG. 3C, there is formed such a light intensity pattern with an inverse peak pattern as that a light intensity is minimum ($I_1$) in a linear area corresponding to the fifth boundary area section 11e as the phase shift portion and the light intensity is substantially monotonously increased toward the circumference in a direction orthogonal to this linear area Here, the greatness of the minimum light intensity $I_1$ obtained in accordance with the phase shift portion varies depending on a gradient of a phase change and an image side numerical aperture NA of the image forming optical system 3. Further, the widthwise dimension W of the inverse peak pattern varies depending on a widthwise dimension W' of the boundary area 11. Furthermore, light intensity $I_2$ in the intermediate portion varies depending on the light intensity of the illumination light supplied from the illumination system 2. That is, in the first embodiment, the conformation of the light intensity distribution with the inverse peak pattern obtained on the processed substrate 4 can be controlled as a whole, and an irregular undulation can be eliminated from the light intensity distribution in the intermediate portion (MS)

As a result, in the first embodiment, a crystal nucleus can be generated at a position where an inclination is large in the light intensity distribution of the inverse peak pattern portion (RS) (i.e., a desired position) or in the vicinity of a position of the minimum intensity without producing a crystal nucleus in the intermediate portion (MS). Moreover, since there is not part where the light intensity is decreased near the boundary between the inverse peak pattern portion and the intermediate portion and the light intensity is slightly monotonously increased toward the center of the intermediate portion, the lateral growth which has started from the crystal nucleus toward the circumference is not restricted to a range of the widthwise dimension of the inverse peak pattern. As described above, in the first embodiment, a crystal nucleus can be generated at a desired position, and the sufficient lateral growth from the crystal nucleus can be realized, thereby generating a crystallized semiconductor film with a large particle size.

In the first embodiment, as mentioned above, in order to obtain the light intensity distribution which sufficiently smoothly varies, it is desirable that the boundary area 11 is formed in such a manner that the width D of each step satisfies the conditional expression (2). In the first embodiment, as described above, it is desirable to use the image forming optical system with a pupil function that a transmittance distribution is lower at the circumference than at the center, e.g., a pupil function that the transmittance distribution is of a Gauss type so as not to substantially leave a small wave (fluctuation) in the light intensity distribution. Specifically, as shown in FIG. 1, it is desirable to arrange a transmission filter 3b having a transmittance distribution corresponding to a desired pupil function on a pupil plane of the image forming optical system 3 or in the vicinity thereof.

In the first embodiment, the first area 12 and the second area 13 are formed flat, and the boundary area 11 has a phase distribution which varies in the step form. However, the present invention is not restricted thereto, and it is generally required to provide a phase distribution which continuously or discontinuously varies from a phase of the first area 12 to a phase of the second area 13. Concretely, it is possible to adopt a modification that the boundary area 11 has a phase distribution which linearly or curvedly varies. Additionally, it is possible to employ a modification that the first area 12 and the second area 13 are formed into slightly curved surfaces according to needs.

In the first embodiment, a phase difference of 360 degrees is given between the first area 12 and the second area 13. However, the present invention is not restricted thereto, and an appropriate phase difference of, e.g., 180 degrees can be given between the first area 12 and the second area 13 in accordance with a desired conformation of the light intensity distribution.

Figure 6:
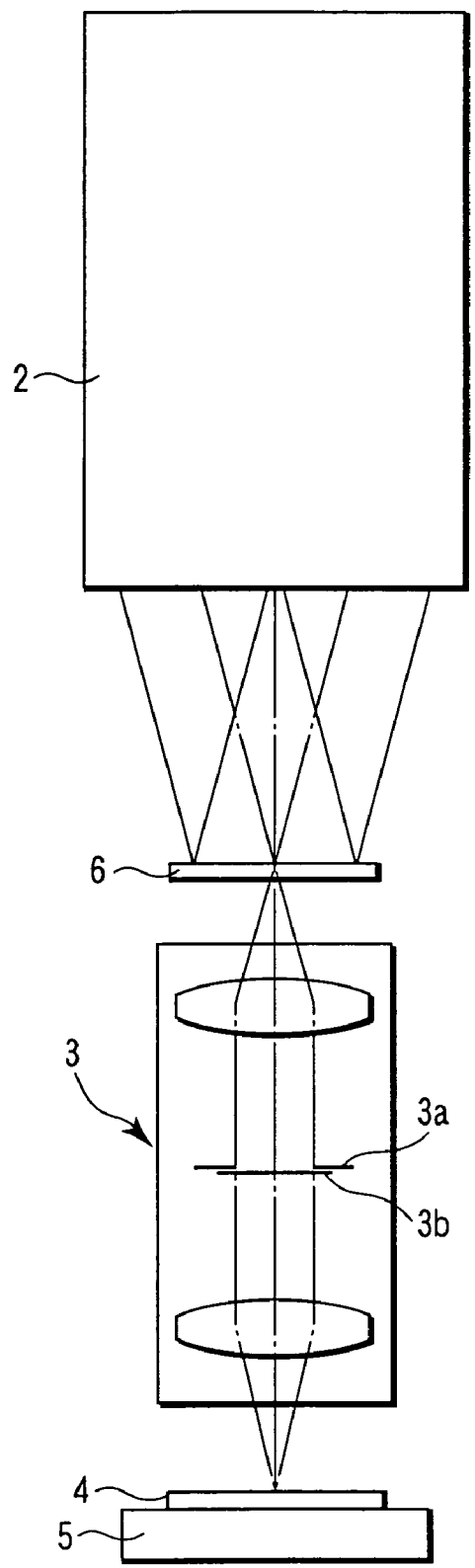
FIG. 6 is a view schematically showing a structure of a crystallization apparatus according to a second embodiment of the present invention.
Figure 7A:
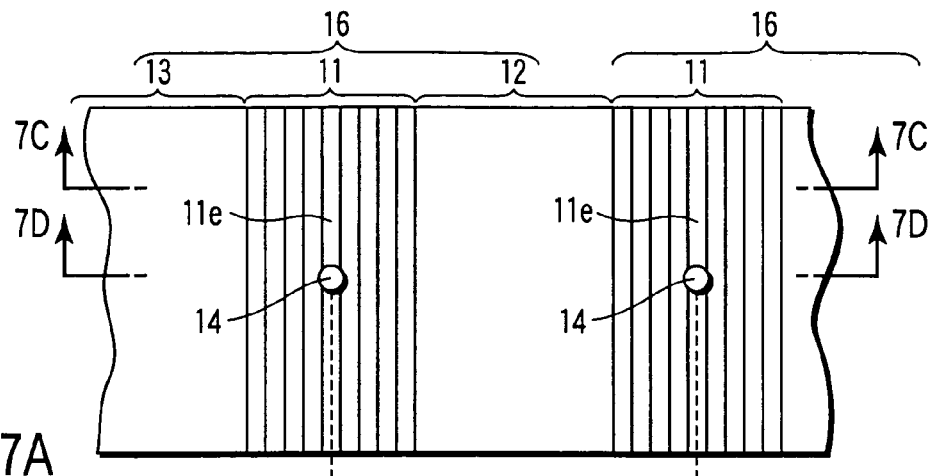
Figure 7B:
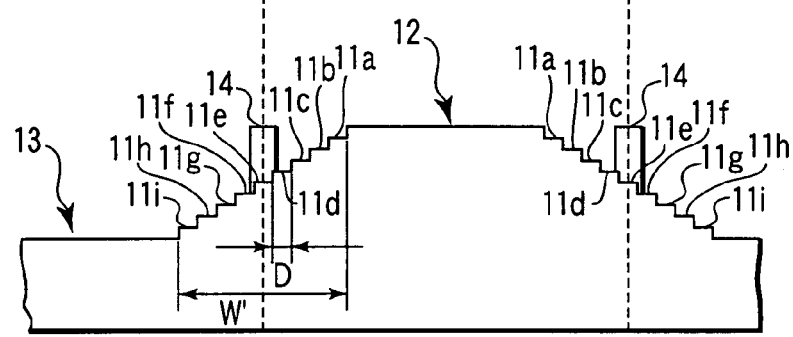
Figure 7C:
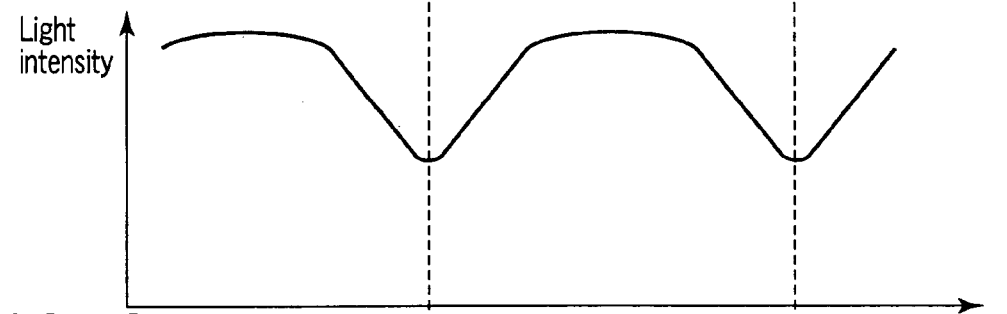

FIG. 6 is a view schematically showing a structure of a crystallization apparatus according to a second embodiment of the present invention. Further, FIGS. 7A to 7C are views schematically showing a structure and an effect of a basic unit part of the phase shift mask according to the second embodiment. The second embodiment has a structure similar to that of the first embodiment. However, only the phase shift mask of the second embodiment is slightly different from the phase shift mask 1 of the first embodiment in structure. Paying notice to a difference from the first embodiment, the second embodiment will now be described hereinafter.

Referring to FIG. 7A, a basic unit part 16 of the phase shift mask 6 (phase shift basic pattern) is constituted by a boundary area 11, a first area 12 and a second area 13 like the basic unit part 10 of the phase shift mask 1 according to the first embodiment. However, as different from the first embodiment, a circular small area 14 is formed in the boundary area 11 of the second embodiment with the fifth boundary area section 11e at the center. Here, a phase difference of 180 degrees as a second phase difference is given between the transmission light of the projected small area 14 and the transmission light of the fifth boundary area section 11e.

Specifically, when the phase shift mask 6 is formed of, e.g., a quartz glass having a refractive index of 1.5 with respect to the light having a wavelength of 248 nm, a step of 248 nm is given between the small area 14 and the fifth boundary area section 11e. Therefore, the small area 14 has the same height position as the first area 12, if the small area is formed by a projection or the same height position as the second area 13 if the small area is formed by a recess. In this example, as shown in FIG. 7B, the small area 14 is formed by a projection to have the same height as the first area 12. In this case, as will be described later, the small area 14 constitutes a phase shift portion in the phase shift mask 6. As to the small area 14 constituting the phase shift portion, a plurality of small areas can be two-dimensionally arranged with respect to each phase shift pattern 16 preferably in the same boundary area section according to needs.

As described above, in the phase shift mask 6 according to the second embodiment, a phase shift pattern which is a combination of the modified line type phase shift pattern according to the first embodiment and a so-called circular type phase shift pattern is formed on a plane opposed to the processed substrate 4. Prior to the explanation of an effect of the phase shift mask 6 according to the second embodiment, an effect of the line type phase shift mask and an effect of the circular type phase shift mask will now be described.

Figure 8A:
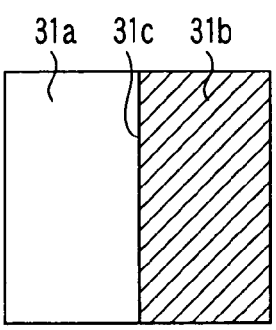
FIGS. 8A to 8D are views illustrating an effect of a line type phase shift mask.
Figure 8B:
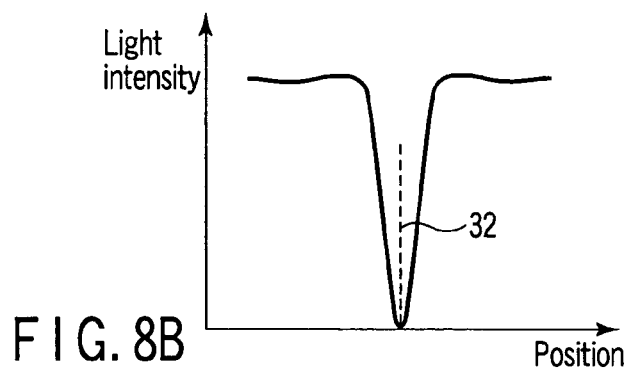

FIGS. 8A to 8D are views illustrating an effect of the line type shift mask. When using the line type phase shift mask in the second embodiment, as shown in FIG. 8A, a phase shift portion is constituted by a linear border line 31c between two areas 31a and 31b having a phase difference of, e.g., 180 degrees (in order to facilitate discrimination from the area 31a, shadow lines are given although it is not a cross section). Therefore, on the processed substrate 4, as shown in FIG. 8B, there is formed a light intensity distribution with an inverse peak pattern such as that a light intensity is minimum (nearly 0) on a line 32 corresponding to the phase shift portion (border line) and the light intensity is one-dimensionally lately increased in a direction (lateral direction in the drawing) orthogonal to the line 32.

Figure 8C:
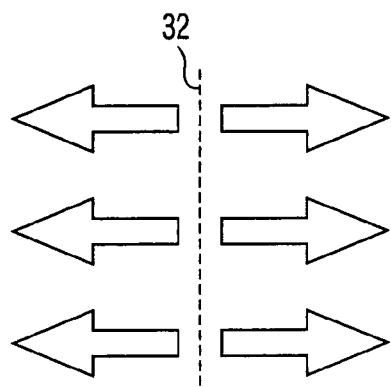

In this case, as shown in FIG. 8C, a temperature distribution becomes minimum along the line 32 corresponding to the phase shift portion, and a temperature gradient (indicated by an arrow in the drawing) is generated along a direction orthogonal to the line 32 corresponding to the phase shift portion. That is, as shown in FIG. 8D, one or more crystal nuclei 33 are generated on the line 32 corresponding to the phase shift portion, and crystallization advances from the crystal nuclei 33 along a direction orthogonal to the line 32 corresponding to the phase shift portion.

Figure 8D:
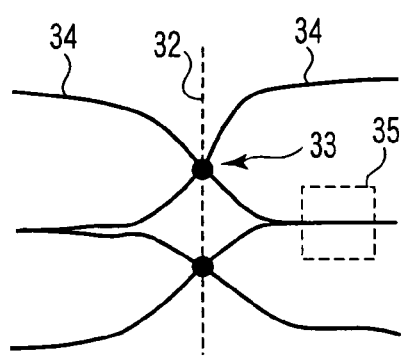

In FIG. 8D, each curved line 34 indicates a grain boundary, and a crystal grain is formed in an area defined by the adjacent curved 1 lines 34. As a result, the crystal nucleus (nuclei) 33 is generated on the line 32 corresponding to the phase shift portion, but where on the line 32 the crystal nucleus 33 is generated is indeterminate. In other words, if the line type phase shift mask is used in the second embodiment, controlling a position where the crystal nucleus 33 is generated is impossible, and an area in which the crystal grain is formed cannot be two-dimensionally controlled. Concretely, it is impossible to control in such a manner that a crystal formation area includes an area 35 in which a channel of a TFT should be formed.

Figure 9A:
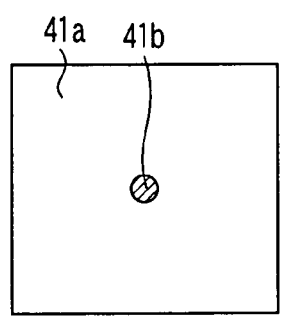
FIGS. 9A to 9D are views illustrating an effect of a circular type phase shift mask.
Figure 9B:
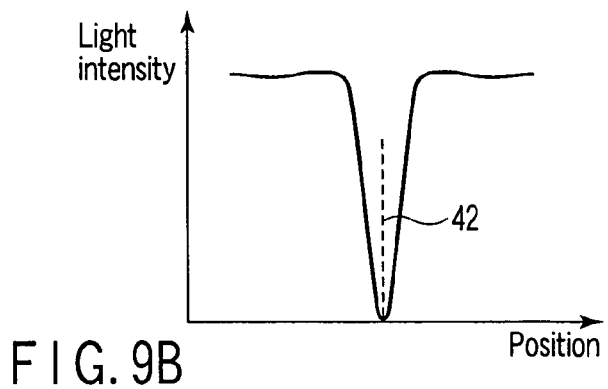

FIGS. 9A to 9D are views illustrating an effect of a circular type phase shift mask. When the circular type phase shift mask is used in the second embodiment, a circular small area 41b having a phase difference of, e.g., 180 degrees in, e.g., a direction along which the phase advances with respect to a rectangular area 41a constitutes the phase shift portion. Therefore, on the processed substrate 4, as shown in FIG. 9B, there is formed a light intensity distribution with an inverse peak pattern such as that a light intensity is in the vicinity of 0 (minimum peak value) in a small area 42 corresponding to the phase shift portion and the light intensity is increased in a radial pattern from the small area 42 toward the circumference.

Figure 9C:
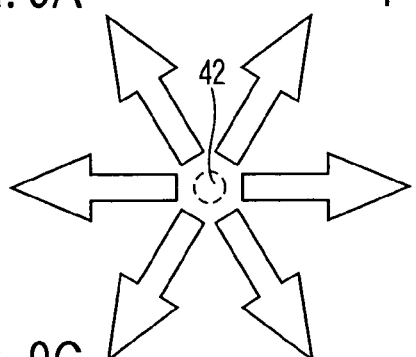
Figure 9D:
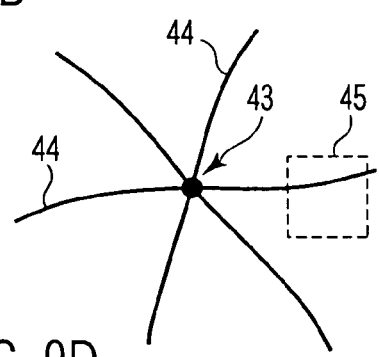

In this case, as shown in FIG. 9C, a temperature becomes minimum in the small area 42 corresponding to the phase shift portion, and a temperature gradient (indicated by an arrow in the drawing) is generated in a radial pattern from the small area 42 corresponding to the phase shift portion toward the circumference. That is, as shown in FIG. 9D, a plurality of crystal nuclei 43 (only one crystal nucleus is shown in FIG. 9D for clarifying the drawing) are generated in the small area 42 corresponding to the phase shift portion or in the vicinity thereof, and crystallization advances in a radial pattern from the crystal nucleus 43 toward the circumference.

When the circular type phase shift mask is used in the second embodiment in this manner, since a plurality of the crystal nuclei 43 are generated in the small areas 42 corresponding to the phase shift portions or in the vicinity thereof, positions where the crystal nuclei 43 are generated can be controlled. However, since growth of the crystals from a plurality of the crystal nuclei 43 simultaneously advances in a radial pattern, positions where the crystal grain boundaries 44 are formed are indeterminate, and areas in which the crystals are formed cannot be two-dimensionally controlled. Specifically, it is impossible to control in such a manner that the crystal formation areas include areas 45 where a channel of a TFT should be formed.

For the further detailed structures or effects of the line type phase shift mask and the circular type phase shift mask, reference can be made to "Optimization of phase-modulated excimer-laser annealing method for growing highly-packed large-grains in Si thin-films, Applied Surface Science 154–155 (2000) 105–111".

The phase shift mask 6 according to the second embodiment has, as described above, the phase shift pattern which is a combination of the modulated line type phase shift pattern in the first embodiment and the circular type phase shift pattern. Therefore, on a cross section of the phase shift mask 6 along the line 7C—7C on the processed substrate 4, which does not cut across the circular small area 14, the same light intensity distribution as that in the first embodiment can be obtained as shown in FIG. 7C. In other words, the light intensity distribution shown in FIG. 7C corresponds to the light intensity distribution shown in FIG. 3C in the first embodiment.

Figure 7D:
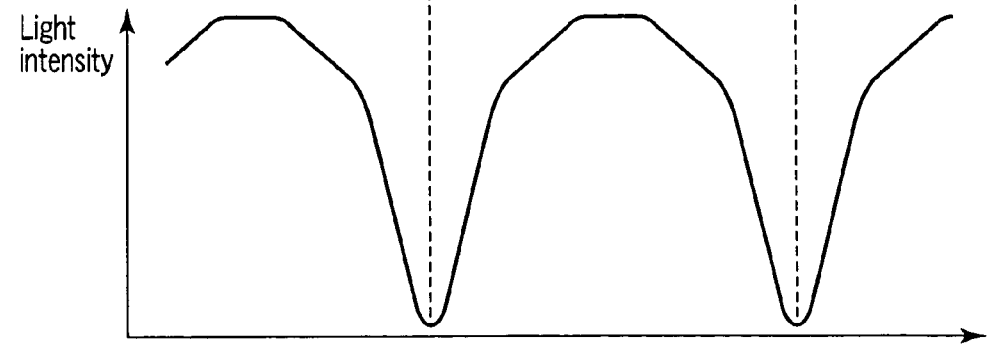

On the other hand, on a cross section along the line 7D—7D which cuts across the circular small area 14, as shown in FIG. 7D, there is formed a light intensity distribution with a two-stage inverse peak pattern defined by such a light intensity distribution as illustrated in FIG. 7C which is formed by the effect of the boundary area 11 and such a light intensity distribution as depicted in FIG. 9B which is formed by the effect of the circular small area 14. That is, on the cross section along the line 7D—7D on the processed substrate 4, there can be obtained a light intensity distribution such as that a light intensity is minimum or close to 0 in an area corresponding to the circular small area 14 constituting the phase shift portion in the phase shift mask 6 and the light intensity is suddenly increased toward the circumference in a direction of a phase change (horizontal direction in the drawing) and then gently and monotonously increased to reach a fixed value.

Figure 10A:
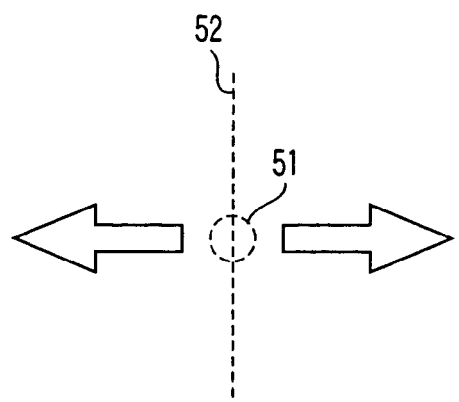
FIGS. 10A and 10B are views illustrating an effect and an advantage of the phase shift mask according to the second embodiment.
Figure 10B:
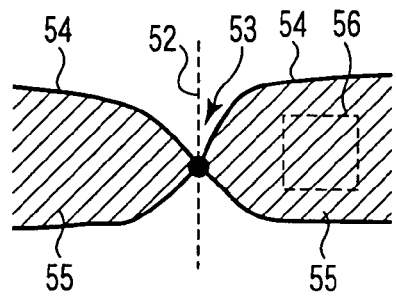

FIGS. 10A and 10B are views illustrating an effect and an advantage of a phase shift a according to the second embodiment. Incidentally, in FIG. 10A, a circular area 51 indicates an area the processed substrate 4 corresponding to the circular small area 14, and a broken line 52 indicates a linear area on the processed substrate 4 corresponding to the fifth boundary area section 11e. In the second embodiment, a temperature becomes maximum in the circular area 51 corresponding to the circular small area 14, and a temperature gradient is generated along a direction (direction of a phase change: horizontal direction in the drawing) orthogonal to the linear area 52 as shown in FIG. 10A. As a result as in FIG. 10B, a crystal nucleus 53 is generated in the circular area 51 corresponding to the phase shift portion or in the vicinity thereof, and crystallization advances from the crystal nucleus 53 along a direction of a phase change.

In this manner, a position where the crystal nucleus 53 is generated is limited to the circular area 51 or in the vicinity thereof, and a direction of a growth of a crystal from the crystal nucleus 53 is one-dimensionally restricted in a direction of a phase change, thereby substantially controlling a formation position of the crystal grain boundary 54. In other words, in the second embodiment, a position of the crystal nucleus 53 can be controlled, and substantially controlling a formation position of the crystal grain boundary 54 can two-dimensionally substantially control a formation area of a crystal 55 defined by the crystal grain boundary 54. Specifically, it is possible to control in such a manner that a formation area of the crystal 55 includes an area 56 in which a channel of a TFT should be formed.

In the second embodiment, the light intensity distribution along the cross section shown in FIG. 7C and the light intensity distribution along the cross section shown in FIG. 7D was actually obtained by a simulation according to a specific numeric value example. In this numeric value example, it was assumed that a wavelength λ of the light was 248 nm and an image side numerical aperture NA of the image forming optical system 3 was 0.13. Further, it was assumed that a widthwise dimension D of each step in the boundary area 11 was 0.5 μm (i.e., a widthwise dimension W' of the boundary area 11 is 4.5 μm) and widthwise dimensions of the first area 12 and the second area 3 was 3 μm.

Figure 11A:
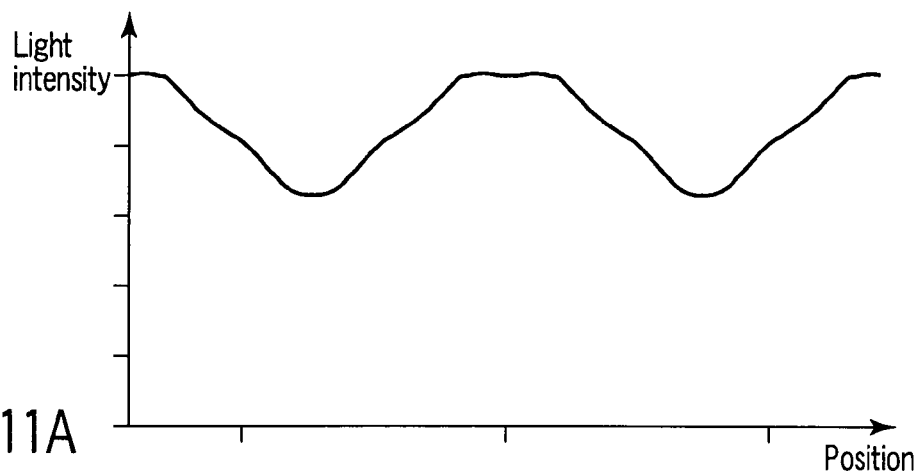
FIGS. 11A and 11B are views corresponding to FIGS. 7C and 7D obtained in a numerical value example, and respectively showing light intensity distributions taken along the line 7C—7C and the line 7D—7D.
Figure 11B:
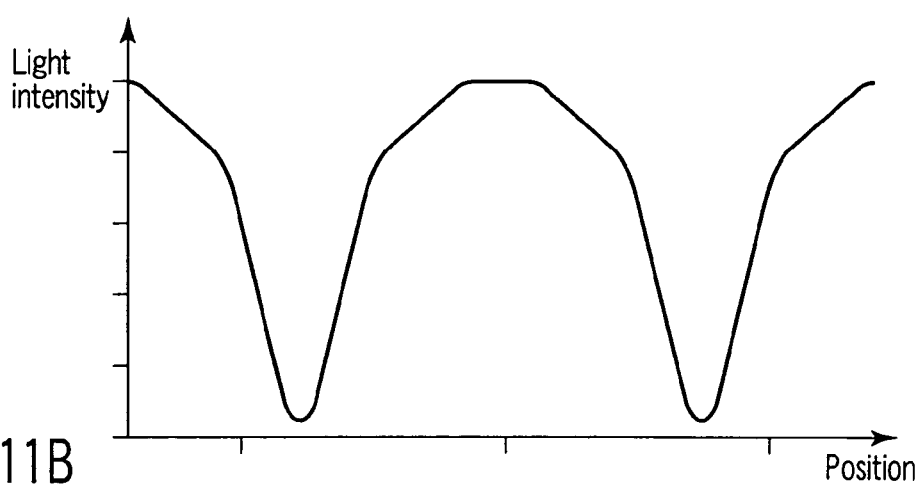

Furthermore, the small area 14 was assumed to have a square shape whose one side is 1 μm (in the embodiment, although it is described that the small area 14 has a circular shape for the convenience's sake, it does not have to have the circular shape, and a rectangular shape is preferable for manufacture). The image forming optical system 3 was assumed to have a Gauss type pupil function with a transmittances distribution of gamma 2.0. FIGS. 11A and 11B are views respectively showing a light intensity distribution along the line 7C—7C and a light intensity distribution along the line 7D—7D obtained in the numeric value example. Referring to FIGS. 11A and 11B, it can be confirmed that it is possible to obtain light intensity distributions substantially corresponding to the light intensity distribution along the line 7C—7C and the light intensity distribution along the line 7D—7D which are typically depicted in FIGS. 7C and 7D by a simulation result.

As described above, in the second embodiment, a crystal formation area can be two-dimensionally substantially controlled by controlling a position of the crystal nucleus, and a sufficient lateral growth from the crystal nucleus can be realized, thereby generating a crystallized semiconductor film with a large particle size. In particular, since the generated crystal with a large particle size has a high electron mobility in a direction of the lateral growth, arranging a source and a drain of a transistor in the direction of the lateral growth can manufacture a transistor with the excellent characteristic.

In the second embodiment, it is desirable to satisfy the following conditional expression (3):

$$r \leq \lambda/NA \quad (3)$$

wherein NA is an image side numerical aperture of the image forming optical system 3, λ is a wavelength of the light, and r is a radius of the circular small area 14 (generally, a radius of a circumscribed circle of the small area 14).

The right side of the conditional expression (3) represents a resolution R of the image forming optical system 3 as described above. Therefore, when the conditional expression (3) is satisfied, dimensions of the small area 14 become not more than the resolution, and a shape of the area in which the light intensity is substantially 0 becomes a solid circular shape instead of a hollow ring shape (toric shape) in the area 51 on the processed substrate 4 corresponding to the circular small area 14 as the phase shift portion. In other words, when the conditional expression (3) is not satisfied, the shape of the area in which the light intensity is substantially zero becomes a ring shape in the area 51 on the processed substrate 4, and a desired light intensity distribution with an inverse peak pattern cannot be obtained.

Specifically, when the image side numerical aperture NA of the image forming optical system 3 is too large, two inverse peak patterns may be formed in parallel, and thus a desired light intensity distribution with the inverse peak pattern may not be obtained. On the other hand, when the image side numerical aperture NA of the image forming optical system 3 is too small, a minimum value of the light intensity becomes substantially larger (much larger) than 0 in the light intensity distribution with the inverse peak pattern, and the desired light intensity distribution with the inverse peak pattern may not be obtained.

Therefore, moreover, $0.05\lambda/NA \leq r \leq \lambda/NA$ is desirable for the following reasons.

Since a "drop" becomes small as r is smaller, selecting optimum r in accordance with the condition can suffice. However, a value with which the effect of drop cannot be obtained will be considered. It is assumed that the drop does not work effectively when a ratio of the drop is not more than 1%.

Assuming that a phase is 180 deg and an area ratio of the small area is $\alpha$, (light intensity)=$\{(1-\alpha)-\alpha\}^2$ The drop is effective when this value is not less than 99%.

$0.99 < \{(1-\alpha)-\alpha\}^2$

∴ $\alpha > 0.0025$

Converting into a dimension ratio, $\sqrt{\alpha} > 0.05$

Therefore, the above expression can be obtained.

Additionally, in the second embodiment, in order to obtain the light intensity distribution which is symmetrical to the linear area 52 on the processed substrate 4 corresponding to the circular small area 14 as the phase shift portion, it is desirable that the small area 14 is formed at a position corresponding to an area where the light intensity is minimum in the boundary area 11 (position of the fifth boundary area 11e). It is to be noted that the small area 14 is formed into a circular shape in the second embodiment, but a shape of the small area is arbitrary. For example, a square small area was used in the simulation.

In the second embodiment, although a phase difference of 180 degrees as a second phase difference is given between the transmission light of the small area 14 and the transmission light of the fifth boundary area 11e in the phase shift mask 6, but the present invention is not restricted thereto, and any other appropriate phase difference can be set as the second phase difference. However, setting the second phase difference to 180 degrees can suppress the light intensity in the area 51 on the processed substrate 4 corresponding to the small area 14 as the phase shift portion to the vicinity of 0 (more than threshold value).

The phase shift mask including the boundary area having a plurality of steps or the boundary area having the small area according to needs can be manufactured by various kinds of techniques, and its example will now be described hereinafter.

A transparent quartz substrate which has a refractive index of 1.5 and opposite surfaces being flat is prepared. One surface of the substrate is partially etched to a depth of 496 nm by selective etching in order to form a second area 13. At this time, portions of one surface which are not etched are the first area 12 and a processed area which is positioned between first and second areas 12, 13 and later becomes the boundary area 11. Subsequently, a resist is applied to the entire above-described one surface of the quartz substrate. Then, the resist is patterned by performing the electron beam lithography and the development, thereby forming a resist pattern having an opening formed at a predetermined position of the quartz substrate, i.e., a position corresponding to the ninth boundary area section 11i. Subsequently, with this resist pattern being used as a mask, dry etching is effected, and an exposed area of the quartz substrate corresponding to the ninth boundary area section 11i is eliminated to a predetermined depth (41.3 nm). Then, this resist is removed from the quartz substrate. Thereafter, a resist pattern having the part corresponding to the ninth boundary area section 11i and a part corresponding to the adjacent eighth boundary area section 11h being the opened is formed on a front surface and only this part is selective-etched to a predetermined depth. Sequentially shifting and repeating such steps from the resist application to the removal in such a manner that etching positions and depths of the quartz substrate can be associated with each boundary area section (nine times when the nine boundary area sections 11a to 11i are provided like the embodiment) a phase shift having a step-like boundary area is formed on the surface of the quartz substrate. When forming the small area, it may be formed by attaching or scraping this part, but it is desirable to simultaneously form the small area when forming the boundary area sections. In order to realize this, it is preferable to pattern the resist when forming, e.g., the middle boundary area section 11e so as to form a convex portion or a concave portion as the small area.

As another method, a resist having thicknesses each corresponding to each boundary area section is formed on the part of the quarts substrate corresponding to the boundary area. In this case, the thicknesses of the resist is set in such a manner that the resist corresponding to the first boundary area section 11a is thickest and the resist becomes gradually thinner in a stepped manner toward the ninth boundary area section 11i. Such a resist whose thickness gradually varies can be formed by changing the energy of an electron beam in accordance with each boundary area section by using, e.g., the electron beam lithography. Thereafter, the boundary area sections with different depths are formed by etching the one surface of the quartz substrate. That is, the part with the thinnest resist corresponding to the ninth boundary area section 11i is etched to the largest depth, the part with the thickest resist corresponding to the first boundary area section 11a is etched to the smallest depth, and the parts corresponding to the second to eighth boundary area sections between these sections are etched to the depths corresponding to the respective thicknesses of the resist.

In this manner, the phase shift mask having the step-like boundary area is manufactured. In such a method, the small area is formed by leaving only this part so as not be etched in case of a protrusion, and it can be formed by performing etching so as to obtain the same depth as that of the second area in case of a dimple.

Figure 12A:
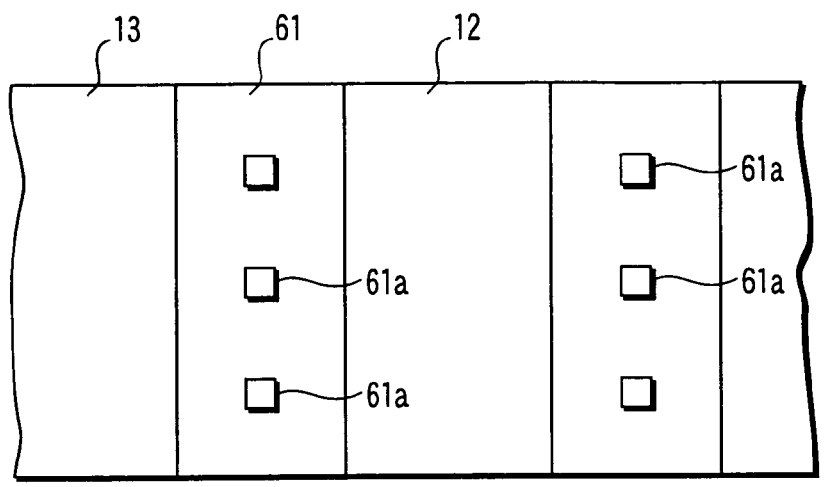
FIGS. 12A and 12B are a plane view and a side view showing a modification of the phase shift mask.
Figure 12B:
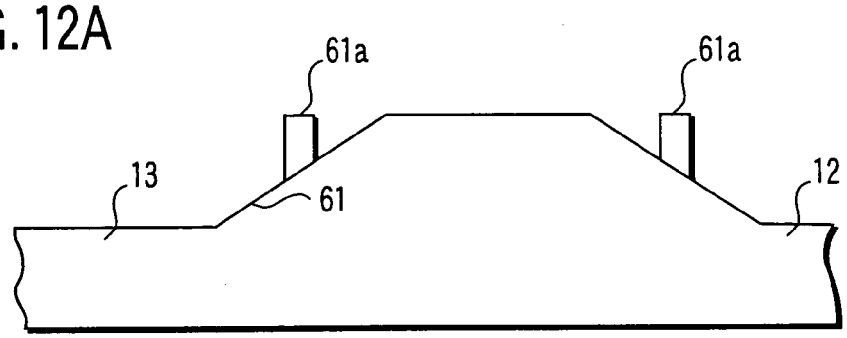

In the phase shift mask, its boundary area is constituted in such a manner that a phase difference is gradually changed by providing a step between the adjacent boundary area sections in the foregoing embodiment, but the present invention is not restricted thereto. For example, as shown in FIGS. 12A and 12B, the boundary area 61 may have a flat inclined surface in such a manner that the phase difference between the first area 12 ad the second area 13 continuously varies. This inclined surface does not have to be flat, and it may be, e.g., a curved surface which protrudes upwards or downwards. In this modification, although the small area 61a is arranged at intermediate position (position away from the first area 12 and the area second area 13 by the equal distance) in the horizontal direction of the boundary area 61, it does not have to be arranged at the precise intermediate position. The shape of the small area is not restricted to a rectangular shape and it may be arbitrary. This small area is formed as a protrusion portion so as to have the same height (same phase) as the first area 12, but it may be a dimple so as to have the same height (same phase) as the second area 13. A plurality of the small areas 61, i.e., three in this example, are provided in one boundary area 61, but the number is not restricted thereto. For example, one small area can suffice.

In each of the above-described embodiments, in order to realize a low pupil function that a transmittance distribution is lower at the circumference than at the center, e.g., a pupil function that a transmittance distribution is of a Gauss type, a transmission filter 3b having a transmittance distribution corresponding to a desired pupil function is arranged on a pupil plane of the image forming optical system 3 or in the vicinity thereof. However, the present invention is not restricted thereto, and it is possible to arrange an aperture filter having a numerical aperture corresponding to a desired pupil function in place of the transmission filter 3b.

Figure 13A:
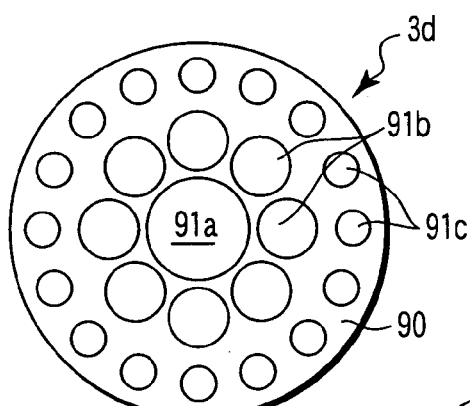
FIGS. 13A to 13C are views showing structural examples of different aperture filters each having a numerical aperture corresponding to a desired pupil function.
Figure 13B:
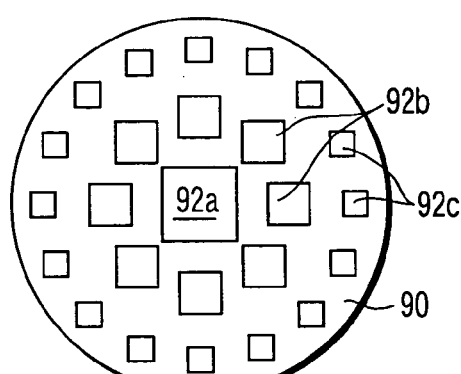
Figure 13C:
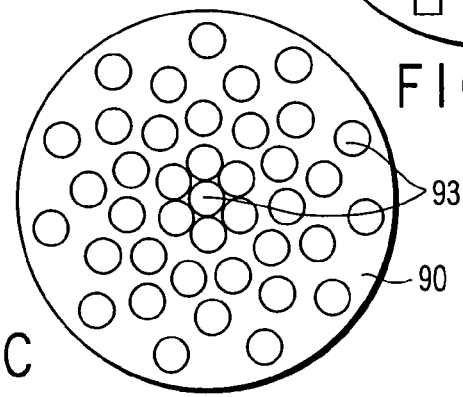

FIGS. 13A to 13C are views showing structural examples of an aperture filter having a numerical aperture corresponding to a desired pupil function. Referring to FIG. 13A, in the aperture filter 3d, one largest circular first opening portion 91a is formed at the center of a non-translucent substrate 90, six medium-sized circular second opening portions 91b are formed around this first opening portion, and 19 smallest circular second opening portions 91c are formed around these second opening portions. In an example shown in FIG. 13B, the opening portions have a rectangular shape instead of a circular shape, and three types of square opening portions 92a, 92b and 92c having different areas are formed on the substrate 90 with, e.g., the same distribution as the circular opening portions in this example. In an example shown in FIG. 13C, opening portions 93 having the same area and the same shape, which is a circular shape in this example, are distributed so as to be coarse toward the far side of the circumference of the substrate 90.

By adopting such shapes, it is possible to realize the aperture filter having a pupil function that a transmittance distribution is lower at the circumference than at the center, e.g., a pupil function that a transmittance distribution is of a Gauss type. In the transmission filter 3b, since the light is transmitted through an optical member, an aberration is apt to occur. In the aperture filter 3d, however, since the light passes without being transmitted through the optical member, the aberration is not generated, and a deterioration in optical performance of the image forming optical system 3 can be avoided.

In each of the foregoing embodiments, although the light intensity distribution can be calculated on a design stage, it is desirable to observe and confirm an actual light intensity distribution on the processed plane (exposed plane). In order to realize this, it is good enough to enlarge the processed plane by the optical system and input a result by an image pickup element such as a CCD. If a light ray to be used is an ultraviolet ray, since the optical system is restricted, a fluorescent screen may be provided to the processed plane in order to convert the light ray into a visible light ray.

Figure 14A:
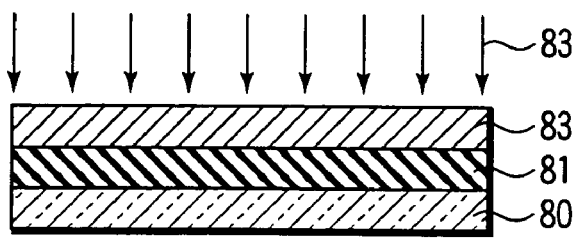
FIGS. 14A to 14E are views illustrating steps of manufacturing an electronic device by using a crystallization apparatus according to each embodiment.

FIGS. 14A to 14E are process cross-sectional views showing steps for manufacturing an electronic device by using the crystallization apparatus according to the embodiment. As shown in FIG. 14A, an underlying film 81 (e.g., a laminated film of an SiN film with a film thickness of 50 nm and an $SiO_2$ film with a film thickness of 100 nm), and an amorphous or polycrystal semiconductor film 82 (e.g., a film made of Si, Ge, SiGe or the like with a film thickness of approximately 50 nm to 200 nm) are sequentially formed on a transparent insulating substrate 80 (e.g., alkaline glass, quartz glass, plastic, polyimide or the like) by using a chemical vapor deposition method or a sputtering method, thereby preparing a processed substrate 4. Subsequently, a part of a surface or an entire surface of the semiconductor film 82 is irradiated with a laser beam 83 (for example, KrF excimer laser beam or an XeCl excimer laser beam) by using the crystallization apparatus and method according to the embodiment.

Figure 14B:
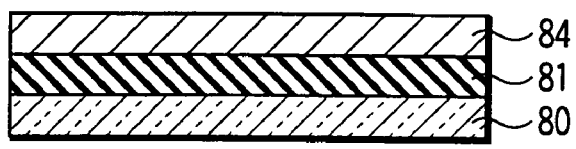
Figure 14C:
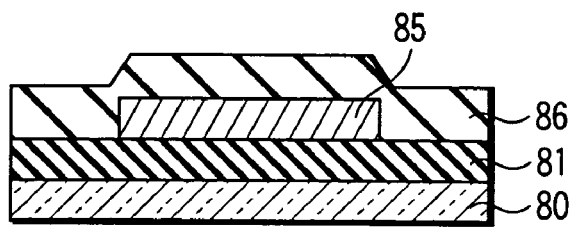
Figure 14D:
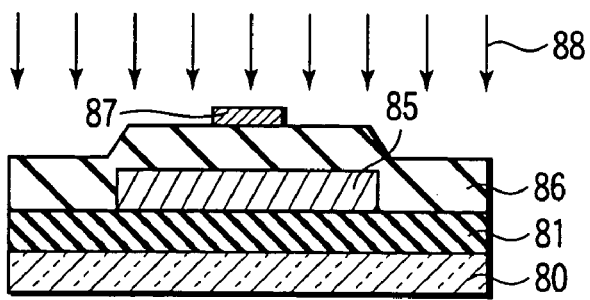

As a result, for the above-described reason, as shown in FIG. 14B, the amorphous or polycrystal semiconductor film 82 changes into a polycrystal semiconductor film or a monocrystal semiconductor film 84 having a large particle size. Then, as shown in FIG. 14C, the polycrystal semiconductor film or the monocrystal semiconductor film 84 is processed into an island-shaped semiconductor film 85 by using a photolithography technique, and an $SiO_2$ film with a film thickness of 20 nm to 100 nm as a gate insulating film 86 is formed on the underlying film 81 including the film provided thereon by using the chemical vapor deposition method or the sputtering method. Furthermore, as shown in FIG. 14D, a gate electrode 87 (e.g., an silicide or MoW) is formed on the gate insulating film 84 at a position corresponding to the center of the semiconductor film 84 by using a known film forming technique and a patterning technique. Then, with the gate electrode 87 being used as a mask, impurity ions 88 (phosphorous in case of an N channel transistor, and boron in case of a P channel transistor) are implanted into the semiconductor film 85. Thereafter, annealing processing (e.g., at 450° C. for one hour) is carried out in a nitrogen atmosphere, and thus the impurities are activated.

Figure 14E:
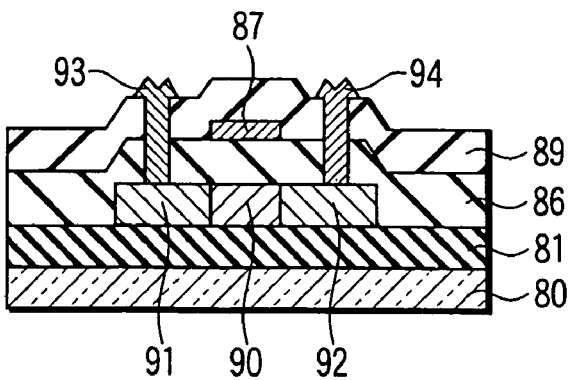

Then, as shown in FIG. 14E, an interlayer insulating film 89 is formed on the gate insulating film 86 including the gate electrode 87. Contact holes are formed to the interlayer insulating film 89 and the gate insulating film 86, and a source electrode 93 and a drain electrode 94 connected to a source 91 and a drain 92 which are connected through a channel 90 are formed in the holes. At this time, the channel 90 is formed in accordance with a position of a crystal with a large particle size of the polycrystal semiconductor film or the monocrystal semiconductor film 84 generated in the steps shown in FIGS. 14A and 14B. By the above-described steps, a polycrystal transistor or a monocrystal semiconductor transistor can be formed. The thus manufactured polycrystal transistor or monocrystal transistor can be applied to a drive circuit such as a liquid crystal display or an EL (electroluminescence) display or an integration circuit such as a memory (SDRAM or DRAM) or a CPU.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A crystallization apparatus comprising:
   a phase shift mask; and
   an illumination system which illuminates the phase shift mask, the crystallization apparatus irradiating a polycrystal semiconductor film or an amorphous semiconductor film with a light ray having a light intensity distribution with an inverse peak pattern that a light intensity is minimum in an area corresponding to a phase shift portion of the phase shift mask, thereby generating a crystallized semiconductor film,
   the crystallization apparatus further comprising an image forming optical system which has an image side numerical aperture set to a value required to generate the light intensity distribution with the inverse peak pattern and sets the polycrystal semiconductor film or the amorphous semiconductor film and the phase shift mask to an optically conjugate relationship,
   the phase shift mask having a boundary area which extends in a first direction across the phase shift mask, and a first area and a second area which are arranged on opposite sides of the boundary area in a second direction intersecting the first direction, and the first and second areas having a predetermined phase difference therebetween, and
   the boundary area having a phase distribution which varies from a phase of the first area to a phase of the second area in the second direction.

2. The crystallization apparatus according to claim 1, wherein the boundary area has a phase distribution which continuously varies along the second direction.

3. The crystallization apparatus according to claim 1, wherein the boundary area has a phase distribution which varies in a step form along the second direction.

4. The crystallization apparatus according to claim 1, wherein the phase shift mask has a plurality of phase shift basic patterns, each consisting of the first area, the boundary area and the second area, the phase shift basic patterns being repeatedly formed along the second direction.

5. The crystallization apparatus according to claim 4, wherein a small area having a predetermined shape is formed in the boundary area, and a second phase difference is given between the small area and a surrounding area of the small area.

6. The crystallization apparatus according to claim 5, wherein the small area is formed at a position corresponding to an area where a light intensity is minimum in the boundary area.

7. The crystallization apparatus according to claim 5, wherein the second phase difference is approximately 180 degrees.

8. The crystallization apparatus according to claim 1, wherein the imaging forming optical system has a pupil function that a transmittance distribution is lower at the circumference than at the center.

9. The crystallization apparatus according to claim 8, wherein the imaging forming optical system has a pupil function that a transmittance distribution is of a Gauss type.

10. The crystallization apparatus according to claim 8, wherein a filter having a numerical aperture corresponding to the pupil function is arranged on a pupil plane of the image forming optical system or in the vicinity thereof.

11. The crystallization apparatus according to claim 5, wherein, assuming that NA is an image side numerical aperture of the image forming optical system, $\lambda$ is a wavelength of the light and r is a radius of a circle circumscribing the small area, the following condition is satisfied:

$$0.05\lambda/NA \leq r \leq \lambda/NA.$$

12. A crystallization method which illuminates a phase shift mask, and irradiates a polycrystal semiconductor film or an amorphous semiconductor film with a light ray having a light intensity distribution with an inverse peak pattern that a light intensity is minimum in an area corresponding to a phase shift portion of the phase shift mask, thereby generating a crystallized semiconductor film, comprising:
   arranging an image forming optical system in a light path between the polycrystal semiconductor film or the amorphous semiconductor film and the phase shift mask;
   setting an image side numerical aperture of the image forming optical system to a value required to generate the light intensity distribution with the inverse peak pattern;
   setting the polycrystal semiconductor film or the amorphous semiconductor film to a position which is optically conjugate with the phase shift mask through the image forming optical system; and
   using, as the phase shift mask, a phase shift mask which has a boundary area extending along a first direction across the phase shift mask, and a first area and a second area which are arranged on opposite sides of the boundary area along a second direction intersecting the first direction, and the first and second areas having a predetermined phase difference therebetween, the boundary area having a phase distribution which varies from a phase of the first area to a phase of the second area along the second direction.

13. A phase shift mask having a boundary area extending along a first direction across the phase shift mask, and a first area and a second area which are arranged on both sides of the boundary area in a second direction intersecting the first direction, and the first and second areas having a predetermined phase difference therebetween, the boundary area having a phase distribution which varies from a phase of the first area to a phase of the second area along the second direction.

14. The phase shift mask according to claim 13, wherein a transparent substrate is provided, the boundary area and the first and second areas are formed on one surface of the substrate, and a plurality of steps are formed to the boundary area so as to extend from the first area toward the second area.

15. The phase shift mask according to claim 13, wherein a small area having a predetermined shape is formed to a part of the boundary area, and a second phase difference is given between the small area and a surrounding area of the small area.

16. The phase shift mask according to claim 15, wherein the small area is formed by a protrusion or a dimple.

17. The phase shift mask according to claim 13, wherein the first direction is orthogonal to the second direction.

* * * * *